United States Patent
Kuyel (12) 
(10) Patent No.: US 6,730,176 B2
(45) Date of Patent: May 4, 2004

(54) SINGLE WAFER MEGASONIC CLEANER METHOD, SYSTEM, AND APPARATUS

(76) Inventor: Birol Kuyel, 3711 Barton Creek Blvd., Austin, TX (US) 78735

( * ) Notice: Subject to any disclaimer, the term of this patent is extended or adjusted under 35 U.S.C. 154(b) by 103 days.

(21) Appl. No.: 10/079,208

(22) Filed: Feb. 20, 2002

(65) Prior Publication Data

US 2003/0010356 A1 Jan. 16, 2003

Related U.S. Application Data (60) Provisional application No. 60/304,316, filed on Jul. 9, 2001.

(51) Int. Cl.⁷ .................................................. B08B 3/12
(52) U.S. Cl. .............................. 134/1; 134/1.3; 134/32; 134/33; 134/902
(58) Field of Search ............................... 134/1, 1.3, 32, 134/33, 902

(56) References Cited

U.S. PATENT DOCUMENTS

| | | | | |
|---|---|---|---|---|
| 4,544,446 A | * | 10/1985 | Cady | 438/689 |
| 5,232,511 A | * | 8/1993 | Bergman | 134/2 |
| 5,980,647 A | * | 11/1999 | Buker et al. | 134/33 |
| 6,463,938 B2 | * | 10/2002 | Bran | 134/1.3 |
| 6,491,764 B2 | * | 12/2002 | Mertens et al. | 134/36 |

* cited by examiner

*Primary Examiner*—Zeinab EL-Arini
(74) *Attorney, Agent, or Firm*—Thompson & Knight, L.L.P.

(57) ABSTRACT

The present invention is directed to a method, system, and apparatus for applying megasonic energy to the surface of a workpiece for the removal of contaminants. A nozzle dispenses a stream of deionized water or other cleaning fluid at a radial position on the surface. A stepping motor moves the arm over the surface, in a step-wise manner, allowing megasonic energy to be applied in a uniform manner. The workpiece is rotated at low speeds to provide a more uniform application. Chemical solutions may optionally be added to dissolve contaminants or change the Zeta potential of the contaminants to make particles easier to detach and suspend. A high-RPM dry spin cycle further removes cleaning fluid and suspended contaminants, preventing them from reattaching. The present invention is compatible with numerous types of workpieces including 12" semiconductor wafers.

24 Claims, 8 Drawing Sheets

SINGLE WAFER MEGASONIC CLEANER METHOD, SYSTEM, AND APPARATUS

CROSS REFERENCE TO RELATED APPLICATIONS

This application claims the benefit of the following U.S. Provisional Application, which is hereby incorporated by reference, and the content of which is not necessarily identical to the content of this application:

| COMMONLY OWNED AND PREVIOUSLY FILED U.S. PROVISIONAL PATENT APPLICATION | | | |
| --- | --- | --- | --- |
| Atty. Dkt. # | Serial Number | Title | Filing Date |
| 058792.004636 | 60/304,136 | Single wafer megasonic cleaner method, system and apparatus | Jul. 9, 2001 |

The benefit of 35 U.S.C. § 120 is claimed for the above referenced commonly owned application. References cited hereafter are incorporated to the greatest extent allowable by law and are illustrative of the state of the art.

BACKGROUND OF THE INVENTION

1. Field of the Invention

The present invention relates generally to the cleaning of a microelectronic workpiece. More particularly, it concerns an improved method and apparatus to remove submicron-sized contaminants from the surface of a workpiece using megasonic energy.

2. Description of Related Art

In general, at one or more stages in the semiconductor fabrication process, there is a need to clean the wafer or other microelectric workpiece to remove contaminants and other residue. Contaminants typically include films, discrete particles, particulates, micro-droplets, vapors and residue.

As the design rule of semiconductor devices decreases to the submicron region, the tolerable size of the contaminants produced during the fabrication process is also decreased. Even extremely small foreign particles may cause fatal defects during the fabricating process, thereby decreasing the reliability and yield of the fabrication facility. As such, cleaning a workpiece to remove particulates and residues down to 0.05 micrometers is important.

These submicron-sized particles are difficult to displace because of strong adhesion forces between the particles and the substrate, such as caused by Van der Waals forces, capillary forces, chemical bonding, and/or electrostatic forces.

Early cleaning techniques used brushes to physically sweep the particles from the surface. However, with the increased level of miniaturization, many substrates are delicate and can no longer be cleaned with brushes. Brushes are abrasive, and the metalization on wafers and masks cannot tolerate such abrasive cleaning processes.

Other prior art systems use high-pressure water jets to direct a liquid stream incident on a rotating wafer to remove contaminants. Often, however, the high pressure within the water column causes damage due to the large forces they exert, particularly to metal patterns on the wafers. Additionally, high-pressure water jets typically require large quantities of deionized water, which may not be economical for a manufacturing environment.

Other cleaning methods include submerging the semiconductor part in a tank having transducers attached to the bottom for applying acoustic energy. The acoustic energy is either in ultrasonic or megasonic frequencies. Ultrasonic cleaning causes cavitation effects, and therefore results in micro explosions that are undesirable for today's microchip manufacturing. As such, megasonic energy has emerged as a preferred way to remove contaminants from a semiconductor parts because it does not cause cavitation. An additional advantage from using a megasonic tank is the ability to clean the top and bottom surfaces of an article simultaneously. However, removing cleaned articles from a tank is problematic because particles frequently reattach to the surface as the article is being removed. This reattachment is possible even when using recirculating tanks with filtering. Another problem is that the tank itself is an acoustical cavity, with standing waves, peaks, and valleys. Further, the energy coupled to the tank is affected by the loading of the tank. Because of both of these problems, the applied megasonic energy density varies between points on a wafer, between wafers within the same tank, and between tanks. Additionally, energy density is limited due to the fact that all energy has to distribute to the full volume of the tank. For example, typical megasonic tanks with megasonic transducers mounted to the bottom of the tank inherently produce an energy density gradient between the top and bottom of the tank. An additional drawback to cleaning semiconductor parts in a tank is the large quantities of cleaning fluids required. These chemicals are expensive and generally hazardous to the environment.

Some prior art systems began incorporating megasonic nozzles in conjunction with other techniques where acoustic energy is transferred to a wafer through a deionized water stream, in an attempt to retain the benefits of megasonic cleaning without using a tank. For example, U.S. Pat. Nos. 5,368,054 and 5,562,778 describe the use of megasonic nozzles to apply energy through a cleaning stream to remove particles from a substrate. Generally, the article such as a wafer or substrate was rotated or moved linearly under the water stream to apply megasonic energy to a total surface area. However, rotation of the wafer and movement of the water stream were generally done without attention to the total energy delivered to each point on the substrate. Therefore, energy density gradients and a corresponding variation in the cleanliness of points on a substrate exist.

U.S. Pat. No. 5,980,647 describes a megasonic nozzle system that mentions the uniform application of megasonic energy. However, during cleaning, the system in the '647 patent rotates the substrate at high RPMs. Use of high-RPM cleaning has a number of disadvantages including inherent non-uniformity of the energy delivered (particularly at low radial lengths), and drying or partial drying of the substrate during the cleaning process. In addition, in the system described in the '647 patent, a nozzle directs the stream of cleaning fluid perpendicular to the surface to be cleaned, which can lead to the stagnation of cleaning fluid on the substrate. Furthermore, the '647 patent does not address the drying the workpiece, which is important to successfully removing contaminants and keeping them from reattaching to the substrate.

Without proper drying, wafers are generally not cleaned successfully. Even in a state-of-the-art clean room a wet substrate is capable of attracting contaminants. Further, if a substrate is subjected to contaminants before drying, contaminants may be bonded to the surface. Therefore, drying a semiconductor part to effectively remove all cleaning fluids before contaminants have the opportunity to reattach is an important step in the cleaning process. Many prior art systems use separate machines for cleaning and drying. Thus, as the workpiece is cleaned, it is removed from the cleaning apparatus and placed into another machine for drying. During the time the workpiece is removed from the cleaning device, transported to the drying device, and placed in the drying device, there is a probability of contamination and of removed particles reattaching.

SUMMARY OF THE INVENTION

In light of the shortcomings of the prior art, it would therefore be desirable to have an apparatus capable of effectively cleaning a semiconductor part and drying the semiconductor part using the same apparatus. It would further be advantageous that if on the same apparatus, chemicals (acids, solvents, surfactants, etc.) could be dispensed for chemical cleaning of hard to remove contaminants or modify pH of the cleaning solution to reduce the electrostatic forces between particles and the substrate prior to loosening or detaching with megasonic energy and then removing debris and drying the surface with a centrifugal force. Such a device may also integrate chemical processing (etching) and cleaning into a single process further reducing the process steps and defects. In addition, other processes such as the detachment process can be carried with the aid of megasonic agitation and then be followed with a complete cleaning. It would further be desirable for using the megasonic energy to passify newly cleaned surfaces by producing very small amounts of Hydrogen that could attach to surface. Other chemicals and reactants, for example hydrogen peroxide, can be formed on the surface with or without the aid of megasonic energy for the improved removal of foreign materials and followed by megasonic cleaning, surface passivation, and spot free drying to achieve better yields.

In one broad respect, the present invention is directed to a method for removing contaminants from a workpiece comprising the steps of: rotating the workpiece about an axis at a low angular velocity; directing a stream of cleaning fluid at a surface of the workpiece, such that the stream of cleaning fluid delivers substantially uniform megasonic energy to all points on the surface of the workpiece, and then rotating the workpiece at a high angular velocity until the surface of the workpiece is dry of cleaning fluids. In a narrow respect, a low angular velocity is between 200 and 500 revolutions per minute. In another narrow respect, a high angular velocity is 3500 revolutions per minute or higher. In another narrow respect, the cleaning fluid comprises deionized water. In a narrower respect, the deionized water is ozonated. In another narrow respect, the cleaning fluid is an acid. In another narrow respect, the cleaning fluid includes one or more surfactants. In another narrow respect, the cleaning fluid is operable to alter the Zeta potential of one or more of the contaminants and the surface of the workpiece to increase the repulsion between the one or more contaminants and the workpiece. In a narrower respect, the method further comprises the step of delivering a cleaning fluid to the workpiece while the workpiece is rotating at a low angular velocity. In another narrower respect, the method further comprises the step of delivering drying fluids to the workpiece while the workpiece is rotating at a high angular velocity. In a narrower respect, the workpiece is a semiconductor wafer.

In another broad respect, the present invention is directed to a method for removing contaminants from the surface of a workpiece, comprising the steps of: rotating the workpiece bout an axis, at a low angular velocity; directing a stream of cleaning fluid, wherein the stream of cleaning fluid comprises megasonic energy, through a nozzle at a surface of the workpiece, while moving the nozzle over the workpiece such that the stream of cleaning fluid delivers substantially uniform megasonic energy to all points on the surface of the workpiece; and then rotating the workpiece at a high angular velocity until the surface of the workpiece is dry of cleaning fluids. In a narrow respect, the step of moving the nozzle over the workpiece further comprises moving the nozzle over the workpiece in a stepwise manner. In another narrow respect, the step of moving the nozzle over the workpiece in a stepwise manner comprises stopping the nozzle over each radial strip for an amount of time proportional to the radial distance of the strip. In another narrow respect, the step of directing a stream of cleaning fluid further comprises directing the stream of cleaning fluid at an optimal angle to the surface of the workpiece. In a narrower respect, the optimal angle is between 60 and 70 degrees with respect to the workpiece surface. In another narrow respect, the nozzle is maintained at a fixed distance from the surface of the workpiece during the step of moving the nozzle over the workpiece. In a narrower respect, the fixed distance is approximately 12 mm.

In another broad respect, the present invention is directed to a method for removing contaminants from the surface of a workpiece having a top surface and a bottom surface, comprising the steps of: rotating the workpiece at a low angular velocity; directing a first stream of cleaning fluid, wherein the first stream of cleaning fluid comprises megasonic energy while moving the first nozzle over the top surface such that the first stream of cleaning fluid delivers substantially uniform megasonic energy to all points on the top surface, wherein at least a portion of the megasonic energy delivered to the top surface propagates through to the bottom surface; directing a second stream of cleaning fluid at the bottom surface of the workpiece; and then rotating the workpiece at a high angular velocity until the workpiece is dry of cleaning fluids. In a narrow respect, the second stream of cleaning fluid comprises deionized water.

In another broad respect, the present invention is directed to a method for cleaning contaminants from the surface of a workpiece, comprising the steps of: applying megasonic energy to at least one stream of cleaning fluid, hereinafter the megasonic cleaning stream; directing at an optimal angle the at least one megasonic cleaning stream to the surface of the workpiece; rotating the workpiece at a low angular velocity sufficient to maintain a uniform laminar flow profile of the megasonic cleaning stream on the surface of the workpiece; and moving the megasonic cleaning stream over the workpiece such that a substantially uniform amount of megasonic energy is delivered to each point on the workpiece. In a narrower respect, the method further comprises the step of rotating the workpiece at a high angular velocity until the workpiece is dry of cleaning fluids.

In another broad respect, the invention is directed to a system for the effective removal of contaminants from the surface of a workpiece, comprising: a chuck operable to hold the workpiece; a spinner motor operable to rotate the chuck about an axis; a fluid source containing a cleaning fluid; a nozzle coupled to the fluid source, wherein the nozzle is operable to apply megasonic energy to the fluid source, and wherein the nozzle is further operable to direct a stream of fluid energized with megasonic energy towards the surface of the workpiece held by the chuck; an arm coupled to the megasonic nozzle, the arm capable of positioning the nozzle over the surface of the workpiece held by the chuck; an arm motor for positioning said arm, wherein the arm motor is a stepping motor; and one or more controllers operable to control the nozzle, the spinner motor, and the arm motor, such that: the nozzle directs the stream of cleaning fluid towards the surface workpiece held in the chuck, the spinner motor rotates the chuck at a low angular velocity, and the arm motor moves the arm and the nozzle transversely over the surface of the workpiece in a step-wise manner such that the stream of cleaning fluid delivers substantially uniform megasonic energy to all points on the surface of the workpiece. In a narrow respect, the low angular velocity is between 200 and 500 revolutions per minute. In another narrow respect, the one or more controllers is further operable to stop the nozzle from directing the stream of cleaning fluid towards the surface of the workpiece, and to rotate the chuck at high angular velocity to dry the workpiece of cleaning fluids. In another narrow respect, the high angular velocity is 3500 revolutions per minute or higher. In another narrow respect, the system further comprises a conduit coupled to the fluid source, wherein the chuck is capable of holding the workpiece in a manner that exposes substantially all of the bottom surface of the workpiece to be cleaned, and wherein the conduit is operable to direct a stream of cleaning fluid to the bottom surface of the workpiece. In another narrow respect, the system further comprises a second fluid source, the second fluid source containing a cleaning fluid, a conduit coupled to the second fluid source, wherein the second nozzle is operable to direct a second stream of cleaning fluid onto the surface of the workpiece. In another narrow respect, moving in a step-wise manner comprises stopping for a controlled length of time proportional to the radial position of the nozzle.

All references incorporated herein are incorporated by reference to the maximum extent allowable by law. To the extent a reference may not be fully incorporated by herein, it is incorporated by reference for background purposes, and indicative of the knowledge of one of ordinary skill in the art.

BRIEF DESCRIPTION OF THE DRAWINGS

The following drawings form part of the present specification and are included to further demonstrate certain aspects of the present invention. The invention may be better understood by reference to one or more of these drawings in combination with the detailed description of specific embodiments presented herein.

DESCRIPTION OF ILLUSTRATIVE EMBODIMENTS

The present invention addresses the shortcomings in the prior art by applying a megasonic cleaning stream in a controlled manner to the workpiece to be cleaned. The term "workpiece" includes semiconductor wafers, virgin wafers, reclaimed wafers, wafers after dicing, wafers after Chemical Mechanical Planerization, ceramic substrates, optical masks, membrane type masks (e.g., scanning electron projection lithography masks), extreme UV multi-layer masks, CD's, disc heads, optical lenses, and/or flat panel displays. For purposes of the present invention, the term "a" is used to mean one or more.

Figure 1:
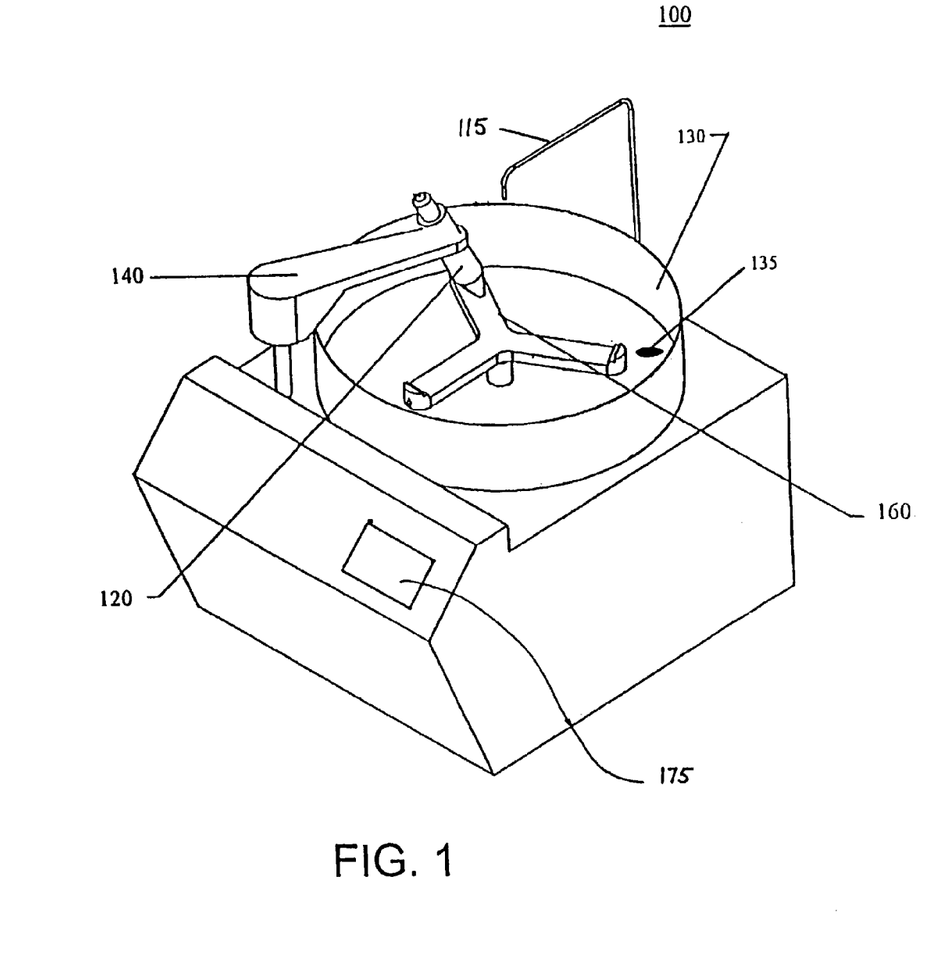
FIG. 1 is an orthogonal view of a megasonic cleaner in accordance with one embodiment of the present invention.

Referring to FIG. 1, a cleaning system 100 in accordance with one embodiment of the present invention is illustrated. Generally, the workpiece to be cleaned is placed in and held by the chuck 160. To remove contaminants, chuck 160 is rotated slowly while a nozzle 120 directs a stream of cleaning fluid 105 (FIG. 2) energized with megasonic energy towards the surface of the workpiece. Arm 140 moves the nozzle 120 over the semiconductor part 125 (FIG. 2) at a fixed distance from the surface. Preferably, the nozzle 120 is moved such that the megasonic energy delivered to each point on the workpiece is substantially uniform. Then, chuck 160 rotates the workpiece at a high rate to dry the surface and prevent removed contaminants from reattaching.

Cleaning fluids 105 are known in the art, and the use of one or more specific fluids is a design decision that may be based on several factors including, the workpiece material and properties; reactivity, kinematic viscosity and pH of the cleaning fluid 105; nozzle geometry; temperature; and the frequency of megasonic energy to be applied. Examples of cleaning fluids 105 include, but are not limited to, deionized water, ozonated deionized water, surfactants, acids, chemical solutions, gas, and combinations thereof. Cleaning fluids 105 may also include particles suspended in one or more of the aforementioned fluids.

Referring back to FIG. 1, chuck 160 may be contained within a bowl 130 to keep the applied cleaning fluid(s) 105 contained. A cover (not shown) may also be used to help assist in this regard. Bowl 130 is preferably made of or coated with a material that is non-reactive with the cleaning fluids 105 to be applied. For example, in one embodiment, bowl 130 is PTFE coated.

Bowl 130 contains a drain 135 to remove applied cleaning fluid 105. Though a single drain is shown, any draining technology or combination thereof may be used without departing from the scope of the invention. In some embodiments, bowl 130 may include a pump. For example, in embodiments applying chemicals to a workpiece, a pneumatic chemical pump is used to aid in the disposal of cleaning fluids 105.

Figure 2:
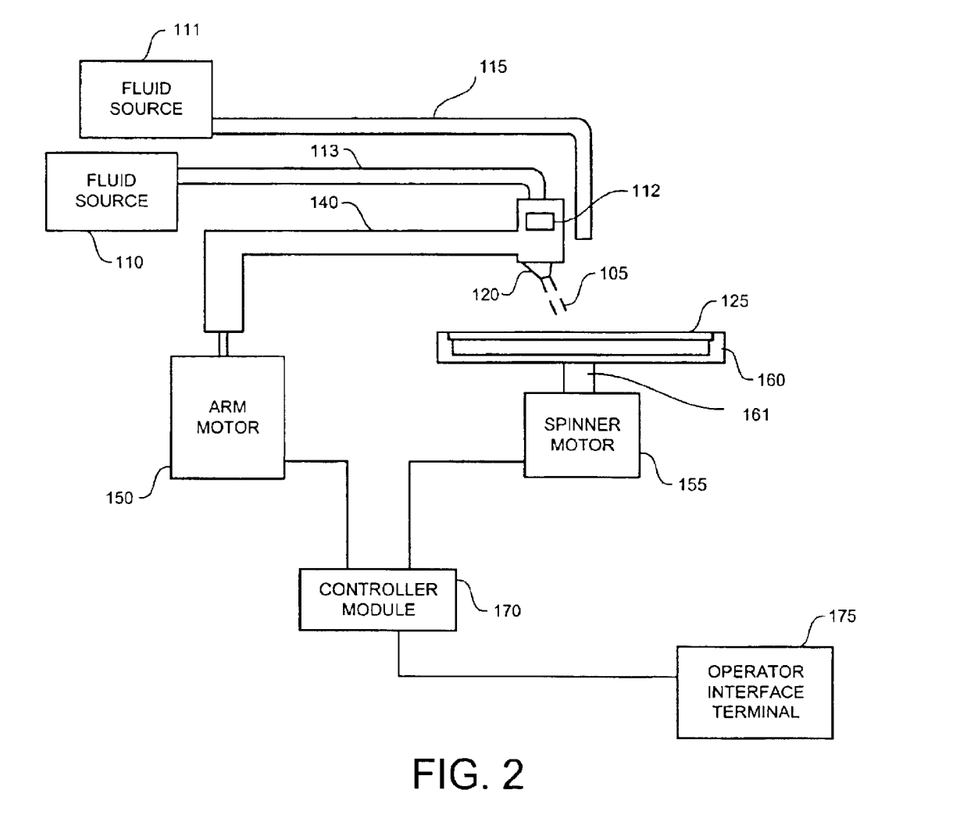
FIG. 2 is a block diagram of a megasonic cleaner in accordance with one embodiment of the present invention.

FIG. 2 is a more detailed block diagram of a cleaning system 100. In particular, the cleaning system 100 includes a chuck 160 for holding a workpiece 125, a spinner motor 155 for rotating the chuck 160, a nozzle 120 for directing a stream of cleaning fluid 105 to a point on the workpiece 125, a transducer 112 within the nozzle 120 for energizing the stream with megasonic energy, an arm 140 for holding the nozzle 120 a fixed distance from the surface of the workpiece 125, an arm motor 150 for positioning the arm, conduit 115 for delivering cleaning fluids 105 to the workpiece from the fluid source 110, a conduit 113 for carrying cleaning fluid 105 to the nozzle 120 from the fluid source 110, and a controller for controlling the spinner motor 155, the arm motor 150, and the application of cleaning fluids 105 to the workpiece 125.

Nozzle 120 is configured to apply megasonic energy generated, by a transducer 112 contained within, to cleaning fluid 105 carried through conduit 113 from fluid source 110, to generate a megasonic stream of cleaning fluid 105. Megasonic nozzles are known in the art and the present invention is not limited to any particular make or manufacturer. In one specific embodiment, a Pulse Jet nozzle made by HONDA ELECTRONICS may be used.

Though a single fluid source 110 is depicted, multiple fluid sources may be used. For example, in some applications, it may be desirable to use different cleaning fluids 105 at different stages of the cleaning process. Pumps may be used to assist in the delivery of fluid 105 through the conduits.

Optionally, one or more conduits 115 may be included to deliver additional cleaning fluid 105 (which may or may not be the same fluid 105 dispensed by nozzle 120) to the surface of the workpiece. In addition, in some embodiments (not shown), it may be desirable to conduit 115 to a nitrogen ($N_2$) fluid source as well as to fluid source 111. Advantageously, the $N_2$ may be used to flush the conduit as well as assist in drying the workpiece 125.

Conduit 115 may be attached to the arm 140 or attached to the cover (not shown). For example, in one embodiment, additional cleaning fluid 105 may be applied to the center of the workpiece 125 through conduit 115 mounted to a stationary position in the cover. The applied chemicals are distributed across the workpiece as the workpiece is rotated. Alternatively or in addition, conduits may be mounted on the arm 140 for dispensing chemicals, deionized water, and other cleaning fluids 105 to the workpiece. The application of such cleaning fluids 105 through arm 140 may be desirable if the reactivity is such that the fluid 105 would quickly die off, evaporate, or decompose. This additional cleaning fluid 105 may be the same as dispensed by nozzle 120, but it may also be different and may include, without limitation, chemicals, gas, or solutions that assist in contaminant removal or drying.

As described in more detail below, the additional cleaning fluid 105 from fluid source 111 may be dispensed at one or more points during the cleaning and/or drying cycles. For example, during the cleaning process, chemicals may be dispensed to dissolve contaminants and/or to increase the repulsion between contaminants and the workpiece (described below in more detail). In one particular embodiment, during the drying process isopropyl alcohol and $N_2$ may be dispensed to assist in drying.

Arm 140 supports and positions the nozzle 120. The arm 140 moves about an axis so that when the chuck 160 is rotating about its fixed axis of rotation 161 by spinner motor 155, the stream of cleaning fluid 105 may be positioned over any point on the workpiece 125. The movement of the arm 140 is directed by arm motor 150. In preferred embodiments, arm motor 150 is a stepping motor that rotates the arm 140 over the workpiece 125 in a step-wise manner (described below in greater detail).

Spinner motor 155 controls the rotation of the chuck 160 and the workpiece 125 that is held thereon. Since the workpiece is cleaned at a lower angular velocity and dried at a higher angular velocity, it is desirable that spinner motor 155 be a variable speed motor. In one particular embodiment, spinner motor 155 is a spinner motor model 6712D from SPECIALTY COATING SYSTEM.

Control module 170 is configured to control the operation of the various components of cleaning system. Although controller 170 is depicted as a single device, it may comprise several controllers. For example, in one embodiment, three or more separate controllers may be used to control the arm motor, the spinner motor, and the dispensing of cleaning fluid 105. It is noted that the use of any one particular controller or type of controller is not limited by the present invention. Examples of controllers include, but are not limited to, programmable logic controllers and personal computers. In some implementations, some of the components may have their own built in controllers. For example, in one specific embodiment, arm motor 150 is a UMK268MAA stepping motor made by ORIENTAL MOTORS that has its own controller.

Further, all or a portion of controller 170 may be mounted on-board the cleaning system, or in its own enclosure or computer that is operatively coupled to the rest of the cleaning system. Similarly, operator interface terminal 175 may be mounted on-board the cleaning system, in its own enclosure, or with controller 170.

Operator interface terminal 175 allows an operator of the cleaning system to control the operation of the cleaning system. In some embodiments, the operator can choose preset cleaning routines. Typically, these routines would be tailored to cleaning and drying specific types of workpieces. In other embodiments, the operator may be able to custom tailor a cleaning routine based upon data supplied by the operator. Preferably, the operator would only need to supply readily available specifications such as the size of a wafer, or the material that it is made of, allowing the control module 170 to make any additional calculations such as rate of rotation, which cleaning fluid(s) 105 to use, and the duration, frequency and order of cleaning cycles. In some embodiments, the operator may be able to override some or all of the automatically calculated parameters. In yet other embodiments, the operator interface terminal 175 is controllable by an automated mechanism, such as a controller in a cluster.

Figure 3:
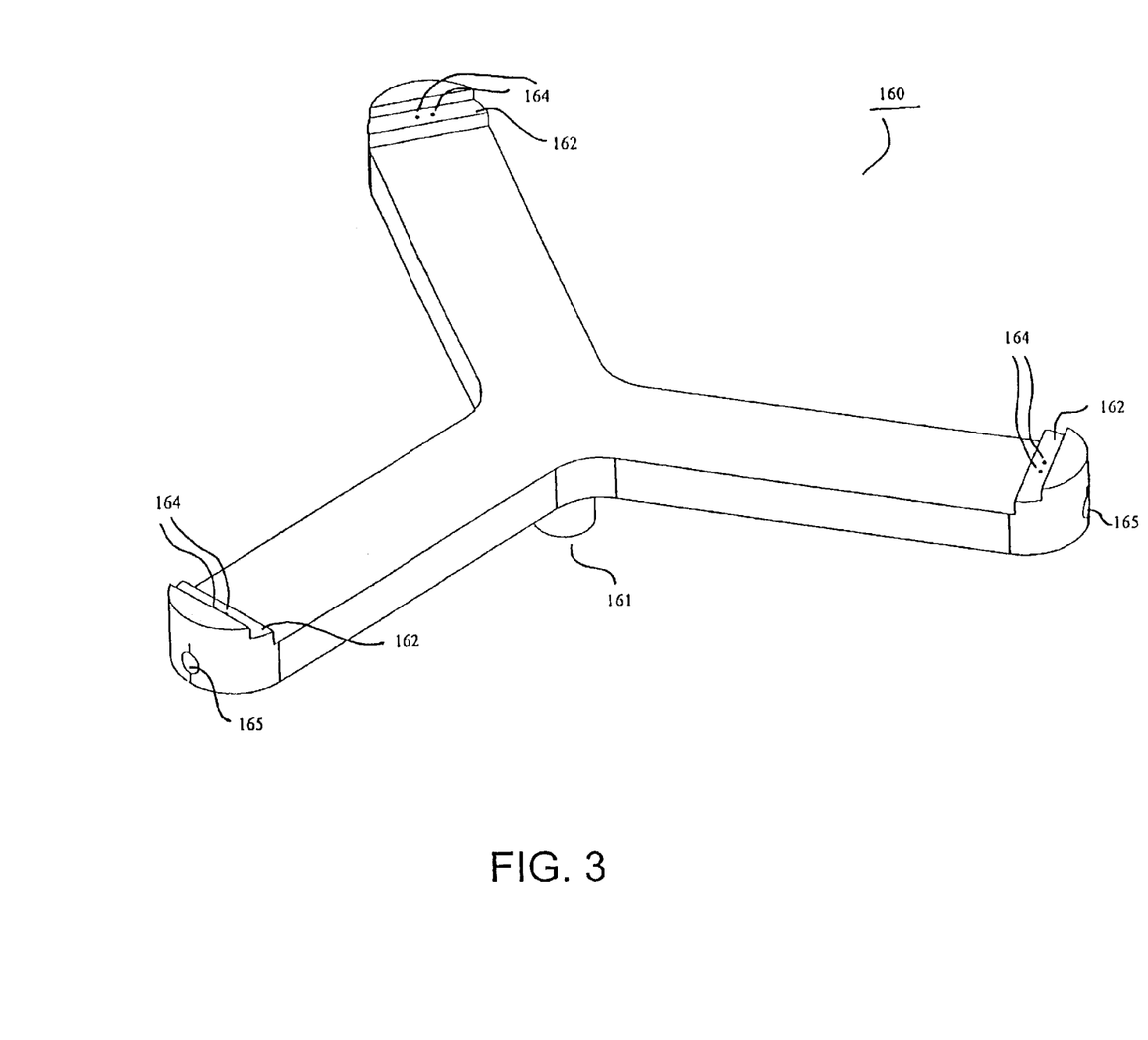
FIG. 3 is a drawing of a chuck for holding a workpiece in accordance with one embodiment of the present invention.

FIG. 3 is an illustration of a chuck in accordance with one embodiment of the present invention. Chuck 160 is configured to hold workpiece 125 securely while stationary and while chuck 160 rotates about its axis of rotation 161, such as during the cleaning and drying processes. As shown, most chucks have one or more physical points of contact 162. As shown, chuck 160 may also include vacuum holes 164 to hold the workpiece 125 securely without damaging it. Vacuum can be applied through the motor shaft to point 161. Points 165 are used to drill through the work piece to connect 164 to 161, and afterwards they are plugged.

A chuck such as that shown in FIG. 3 which exposes much of the bottom surface of the workpiece 125 may be desirable for applications where the bottom surface is cleaned as well as the top surface. Because chuck 160 has limited contact with the bottom surface, enough of the bottom surface is exposed such that the bottom surface may be cleaned without repositioning the workpiece. In one embodiment, the bottom surface may be cleaned by megasonic energy applied to the top surface traveling through the workpiece 125 to dislodge particles from the bottom surface. Further, the bottom surface may also be wetted with a cleaning fluid spray, to more easily detach contaminant particles.

Figure 4:
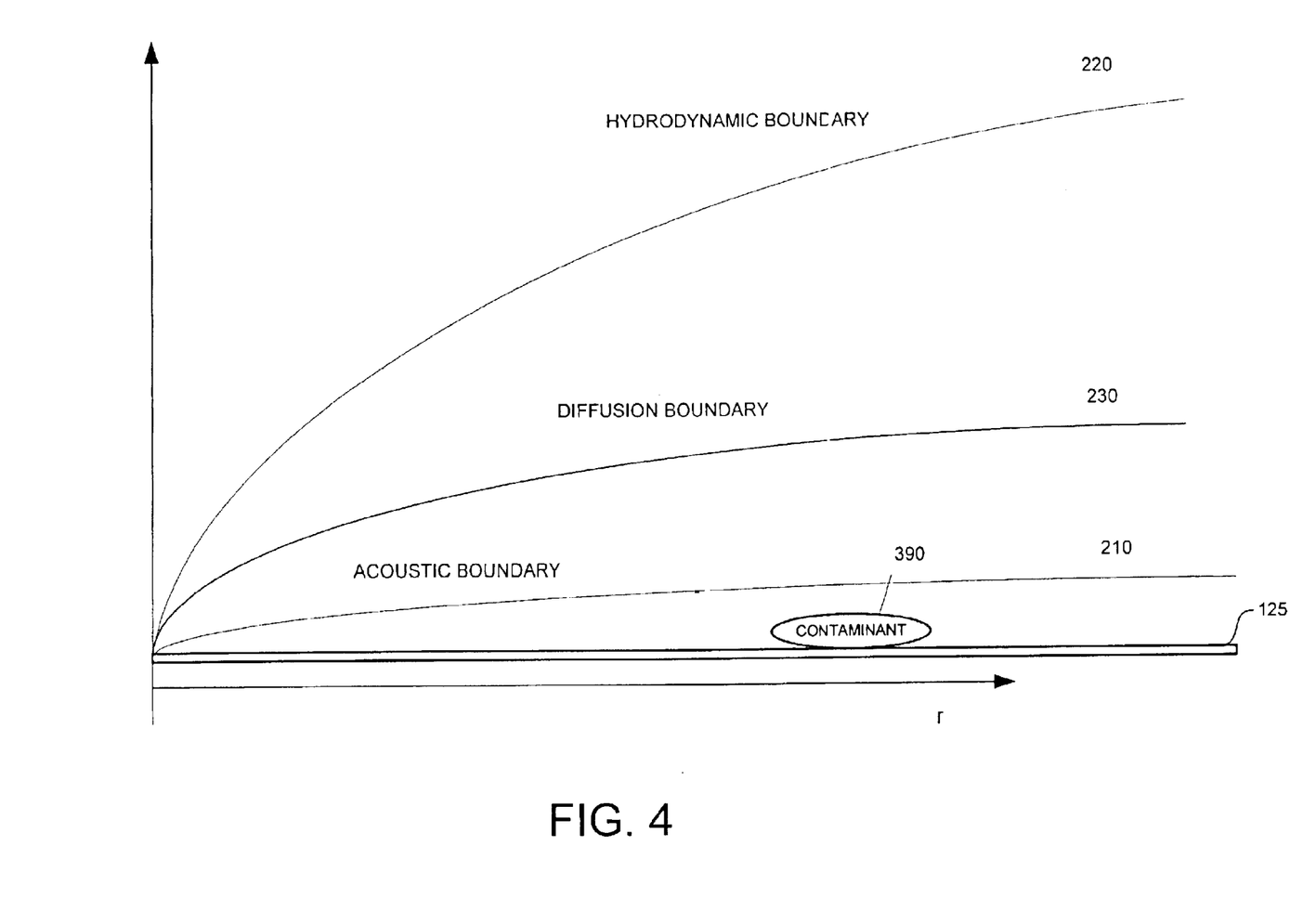
FIG. 4 is an illustration depicting the relative sizes of the hydrodynamic, diffusion, and acoustic boundary layers on a workpiece.

FIG. 4 illustrates the types of boundary layers that may be present on a workpiece during the cleaning process. In operation, the cleaning fluid 105 rushes past the workpiece being cleaned, forcing fluid 105 onto contaminant particles, removing them is from the surface, and carrying them away. On a microscopic scale, the fluid 105 friction at the surface causes a very thin layer of the fluid 105 to move more slowly than the cleaning stream. This layer of slow-moving fluid 105 at the substrate surface is commonly known as the boundary layer. The boundary layer effectively shields the substrate surface from fresh fluid 105 and shields contaminants from the removal forces of the cleaning stream, causing them to remain on the workpiece. Further, fresh chemistry does not effectively reach the interface of small surface features. Still further, cleaning times may be unacceptably long. By decreasing the size of the boundary layer, increased removal of sub-micron particles and increased particle removal can be attained.

The largest boundary layer shown in FIG. 4 is the hydrodynamic boundary layer 220 ($\delta_h$), and is generated by the hydrodynamic removal of contaminants by the cleaning stream. Because of the miniscule size of many contaminants (see, e.g., contaminant 390) compared to the hydrodynamic boundary layer 220, it is futile to remove them solely with hydrodynamic flow. For a stream of cleaning fluid 105 moving across the surface of workpiece 125, the hydrodynamic boundary layer 220 ($\delta_h$) is inversely proportional to the angular velocity, and is calculated as $$\delta_h = 0.526 r \left(\frac{\gamma}{r^2 \omega}\right)^{\frac{1}{5}} \quad \text{(Eq. 1)}$$

where r is the radial position, $\gamma$ is the kinematic viscosity of the fluid 105, and $\omega$ is the angular velocity such that $\omega=2\pi F$, and F is the number of rotations per second.

A cleaning flow energized with sonic energy has its own boundary layer, called the acoustic boundary layer 210, that is generally smaller than the hydrodynamic boundary layer 220. For example, the acoustic boundary layer $\delta_{ac}$ 210 for deionized water at room temperature and energized with megasonic energy at a frequency of 3 MHz, is about 0.35 microns. In contrast, for a radial flow of deionized water on a wafer rotating at 1000 RPM at a radius of 10 cm, the hydrodynamic boundary layer $\delta_h$ 220 is about 3290 microns, and it is larger at smaller radii. Accordingly, because of the size of the hydrodynamic boundary layer, and considering that contaminants may be as small as 0.05 microns, megasonic energy is more effective than hydrodynamic mass transfer for detaching contaminants from a semiconductor part.

The acoustic boundary layer thickness 210 is a function of the frequency of the megasonic energy applied to the workpiece 125 and the kinematic viscosity of the fluid 105. Specifically, with a laminar flow, the acoustic boundary $\delta_{ac}$ 210 is calculated as $$\delta_{ac} = \left(\frac{2\gamma}{\omega}\right)^{\frac{1}{2}} \quad \text{(Eq. 2)}$$

where $\omega=2\pi f$, $f$ being the frequency of the megasonic energy and $\gamma$ is the kinematic viscosity of the fluid 105. Accordingly, the acoustic boundary layer 210 can be reduced by increasing the acoustic frequency of the megasonic energy in the cleaning stream. This may be achieved by selecting or designing transducer 112 with the desired frequency. Advantageously, the acoustic boundary layer 210 may be reduced while keeping the angular velocity of the substrate relatively low. In addition, the lower rate of revolution makes it easier to deliver uniform energy, particular towards the center of the rotating substrate. In one specific embodiment, the angular velocity of the substrate is between 200 and 500 RPM. The system would function with rates of 500 RPM or higher, but at a decreasing efficacy.

The selection of a particular transducer operating frequency is an important consideration, because it can determine the size of particles that can be removed. For example, the removal of smaller particles and residue may require higher frequencies on the order of 3 MHz because the smaller particles may be exposed with the thinner acoustic boundary layer 210, and at higher frequencies, more efficient momentum transfer is possible for smaller masses or particles. However, at very high frequencies, the ability to move larger particles decreases. Therefore, it may be desirable to choose an operating frequency that is high enough to remove particles, but no higher. In some embodiments (not shown), multiple nozzles having transducers 112 of differing megasonic frequencies can be used. These may be mounted on multiple arms or on the same arm. As discussed in more detail below, different frequencies affect different size particles, so the use of transducers with a range of frequencies 112 may remove a broader range of contaminants.

Further, megasonic energy may be used to passify newly cleaned surfaces prior to drying. Other chemicals and reactants, for example hydrogen peroxide, can be formed on the surface with or without the aid of megasonic energy for the improved removal of foreign materials and followed by megasonic cleaning, surface passivation, and spin-drying to achieve better yields.

Another boundary layer that affects the removal of contaminants is the diffusion boundary layer 230. The diffusion boundary layer 230 is 20 micrometers for 1.5 micrometer particles and 60 micrometers for 0.05 micrometer particles. The diffusion boundary layer 230 is typically larger than the acoustic boundary layer 210 but much smaller than the hydrodynamic boundary layer $\delta_h$ 220. The velocities in the diffusion boundary layer are much slower than those in the hydrodynamic boundary layer. After megasonic energy detaches contaminants from the surface, the contaminants continue to rise so long as megasonic energy is applied. Contaminants above the diffusion boundary layer 230 are easily removed before they can reattach. Contaminants in the diffusion boundary layer 230 unless removed by the centrifugal forces may eventually reattach to the surface due to a concentration gradient.

Figure 5A:
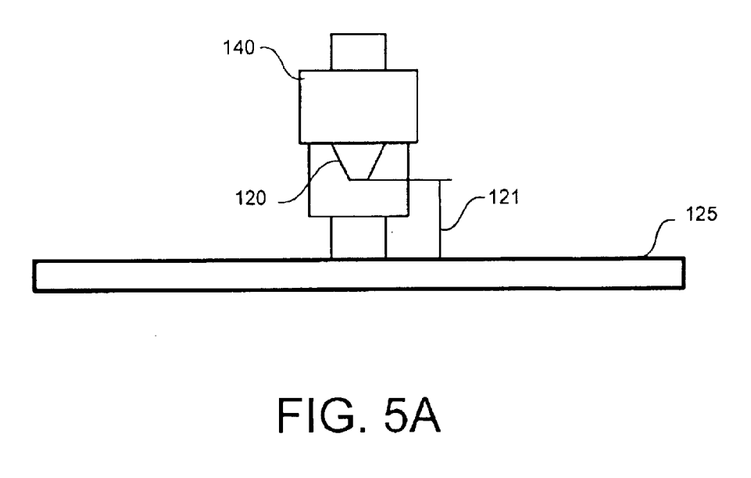
FIG. 5A is a front view of the nozzle in relation to the arm and workpiece.

FIG. 5A is an illustration of the nozzle as viewed from one vantage point. The nozzle 120 is attached to the arm 140, over the surface of the workpiece 125. A benefit of this positioning the nozzle 120 is that when a workpiece 125 is rotating and carrying the cleaning fluid 105 away from the nozzle 120, the local delivery of megasonic energy is independently controlled from rotation of the workpiece 125.

The working distance 121 between the tip of the nozzle 120 and the surface of the workpiece 125 and the nozzle angle with respect to the wafer surface is chosen for an optimal working distance where megasonic energy is substantially focused. The working distance 121 is largely a function the particular nozzle that is used. For example, with the Pulse Jet nozzle made by HONDA ELECTRONICS, a working distance 121 of 12 mm may be used.

In some embodiments, the working distance 121 is chosen such that the stream of cleaning solution contacting the workpiece 125 is a laminar flow. Laminar flow is maintained by proper choice of flow rate, which needs to be large enough to cool the transducer but low enough to avoid substantial turbulence. Turbulent flow may produces density discontinuities that would reflect megasonic energy and inhibit the efficient transfer of megasonic energy to the surface. In addition, with a non-turbulent hydrodynamic boundary layer 220 is the cleaning fluid flow 105 acts as more efficient conduit of megasonic energy to the surface.

Figure 5B:
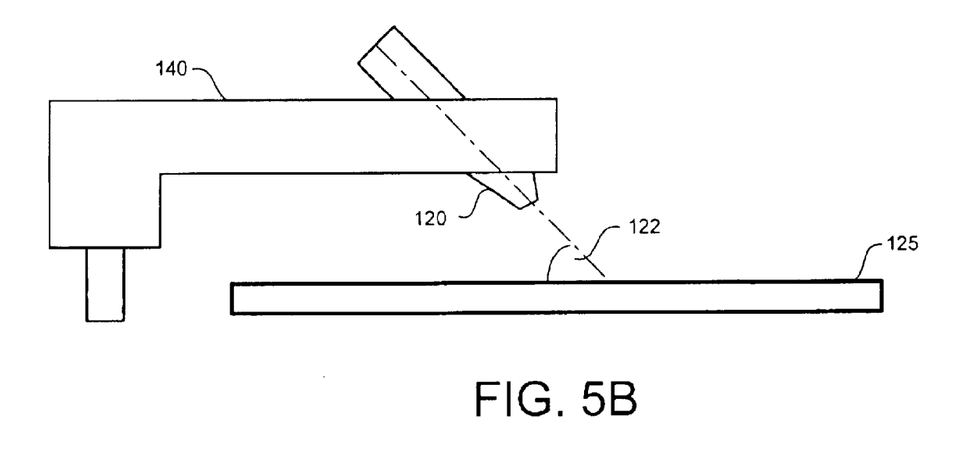
FIG. 5B is a side view of the nozzle in relation to the arm and workpiece.

FIG. 5B is an illustration of the nozzle as viewed from a point perpendicular to the vertical plane of the arm perpendicular to the surface. In some embodiments, the angle of the nozzle with respect to the surface of the substrate 125 is optimized to maintain a uniform flow profile (described below). Since the centrifugal acceleration of a molecule of cleaning fluid 105 on the substrate is proportional to the position of the molecule on the substrate, as the radial distance of the molecule increases, the acceleration and radial velocity of the cleaning fluid molecule increase proportionally. By keeping the rate of revolution of substrate 125 low and the nozzle 120 positioned at an optimal angle 122, variation of the spot size and shape with radial position is minimized.

Preferably, optimal angle 122 is between 60–70 degrees with respect to the workpiece 125, hereinafter the "optimal angle." If nozzle angle 122 is orthogonal to the surface of the workpiece 125, stagnation may occur at the point where the cleaning fluid stream 105 contacts the surface. Such stagnation traps particles, reducing the effectiveness of the cleaning process. By positioning the nozzle 120 in the plane of the arm 140 so that cleaning fluid 105 contacts the surface of the workpiece 125 at an angle 122 between 60–70 degrees, detached particles are swept away from the point of contact with a gentle shear force. These particles may remain suspended in the diffusion boundary layer 230 or the hydrodynamic boundary layer 220, as discussed above, and later removed with a high-RPM spin dry.

Figure 6A:
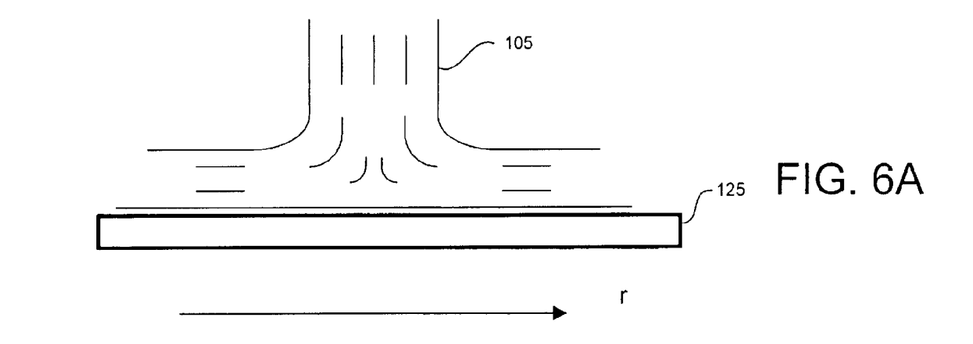
FIG. 6A is an illustration depicting a stream of cleaning fluid having a symmetric flow profile.
Figure 6B:
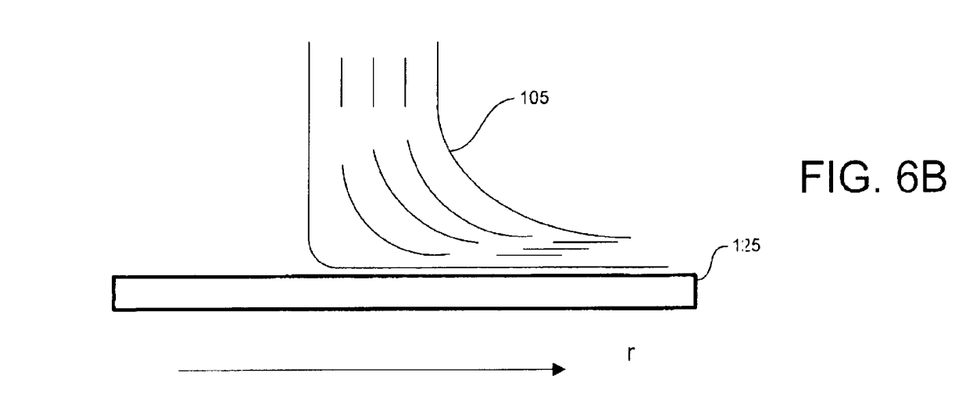
FIG. 6B is an illustration depicting a stream of cleaning fluid having an asymmetric flow profile.

FIGS. 6A and 6B are illustrations of the flow profiles for streams of cleaning fluid 105 contacting a rotating workpiece surface at low and high RPMs, respectively. Specifically, FIGS. 6A and 6B illustrate the differences between the uniform flow profile of a cleaning fluid stream 105 contacting the surface of a workpiece 125 rotating at low RPMs and a non-uniform flow profile of an identical cleaning fluid stream 105 contacting the surface of a workpiece 125 rotating at high RPMs.

In both FIG. 6A and FIG. 6B, cleaning fluid 105 leaves the nozzle 120 in a laminar flow profile. The initial section of the flow is the transverse flow from the nozzle 120 outlet. As the cleaning fluid 105 contacts the surface, the flow transitions from a flow perpendicular to the surface (as viewed from any point on the arm 140 in the plane perpendicular to the surface) to a flow parallel to the surface.

In the preferred embodiment having a uniform flow profile, as shown in FIG. 6A, the horizontal flow velocity on workpiece 125 immediately under the nozzle 120 is not a function of the radial position. Optimally, the cleaning fluid stream 105 contacting the surface has circular symmetry (locally isotropic) to deliver megasonic energy at any radial position on workpiece 125, since megasonic energy propagates through the cleaning fluid 105. However, the centrifugal forces acting on the cleaning fluid stream 105 as it contacts the substrate moves cleaning fluid molecules radially outward. Therefore, workpiece 125 rotating about a fixed axis produces an asymmetry in the flow profile that is proportional to the angular velocity of the workpiece 125 and the radial position of the cleaning fluid stream 105 on the workpiece 125. Without symmetry in the flow profile, the energy delivered to the surface is also a function on the angular velocity and the radial position on the workpiece 125.

At high rate of rotation, an asymmetric cleaning fluid stream 105 as shown in FIG. 6B is generated, carrying some of the megasonic energy to neighboring positions positioned radially outward, creating variations in the total megasonic energy levels applied to the workpiece 125. As such, it is difficult to model and predict the delivery of megasonic energy, and thereby difficult to compensate for energy coupling efficiency that varies with RPM and radial position. Accordingly, the delivery of uniform energy to all parts of substrate 125 is very difficult if not impossible.

In one embodiment of the present invention, the workpiece 125 rotates at low RPMs (between 200 and 500) to produce a more uniform flow profile. At these RPMs the centrifugal forces are relatively low, and the effects of rotation on the cleaning fluid flow profile are lessened since the motion of cleaning fluid molecules on the surface is largely determined by the volume flow from the nozzle 120 rather than velocities resulting from centrifugal forces. In addition, at low RPMs, locally isotropic cleaning fluid flows can be achieved even at the perimeter of the workpiece 125.

As a further advantage to rotating workpiece 125 at lower RPMs, it is easier to keep the entire substrate wet, preventing contaminants from reattaching and drying back onto the surface. This is due largely in part to the decreased incidence of the cleaning fluid hydroplaning above and off of the substrate 125 at lower RPMs. As the RPM of the substrate increases, hydroplaning occurs more readily, resulting in a decreased contact area and a corresponding decrease in the effectiveness of the cleaning. During the cleaning process, it is desirable to keep the entire substrate wet to prevent contaminants from reattaching and drying back onto the surface. Further, once contaminants are dislodged from the surface, it takes time for them to rise above the hydrodynamic boundary layer to be carried off by the cleaning fluid 105. During this time the surface must remain wet and possibly more than once megasonic agitation would be required. The higher contaminants rise in the hydrodynamic boundary layer, the more likely they will be removed before they can reattach. Although excess cleaning fluids 105 could be supplied to maintain a wet substrate, this may be undesirable for environmental and cost concerns.

Referring back to FIG. 2, the movement of the arm 140 is directed by arm motor 150. In preferred embodiments, arm motor 150 may be a stepping motor that rotates the arm 140, stopping for a controlled length of time proportional to the strip length for every radial strip. For a workpiece 125 rotating about a central axis at constant angular velocity, the total energy (E) per unit area (A) is related to the radial position and the time by the following equation:

$$\frac{E}{A} = \frac{P \times t}{2\pi r \times \Delta r} \qquad (Eq. 3)$$

where P is the megasonic power delivered to the workpiece 125, r is the radial position and $\Delta r$ is the width of the strip. If the total energy per unit area remains constant ($E/A$= const.), the power P is constant (P=const.), and the width of each strip is constant ($\Delta r$=const.), then the time spent over any point is proportional to the radial distance ($t \propto r$).

When a workpiece 125 rotates at constant speed, energy applied by nozzle 120 that is moving at a constant speed distributes unequal levels of total energy to all points on the workpiece 125. Prior art systems (such as that described in U.S. Pat. No. 5,980,647) attempted to correct this variation in total energy levels by keeping the rotational speed constant, using variable speed motors to vary the speed of the nozzle with its radial position of the strip. However, as the radial position, r, of the strip approaches zero (corresponding to close proximity to the axis of rotation), the time spent over any point also approaches zero to maintain an equal level of total energy distributed to each point. Thus, the speed of the motor must approach infinity. Since the speed can never reach infinity, the prior art had an increased amount of error delivering constant megasonic energy near the center of a workpiece 125.

In contrast, the present invention provides uniform energy to all point on the workpiece 125 by moving the nozzle 120 in a stepwise manner such that at each discrete radial position, it spends a time proportional to the radial length. This may be accomplished using a stepping motor.

Figure 7:
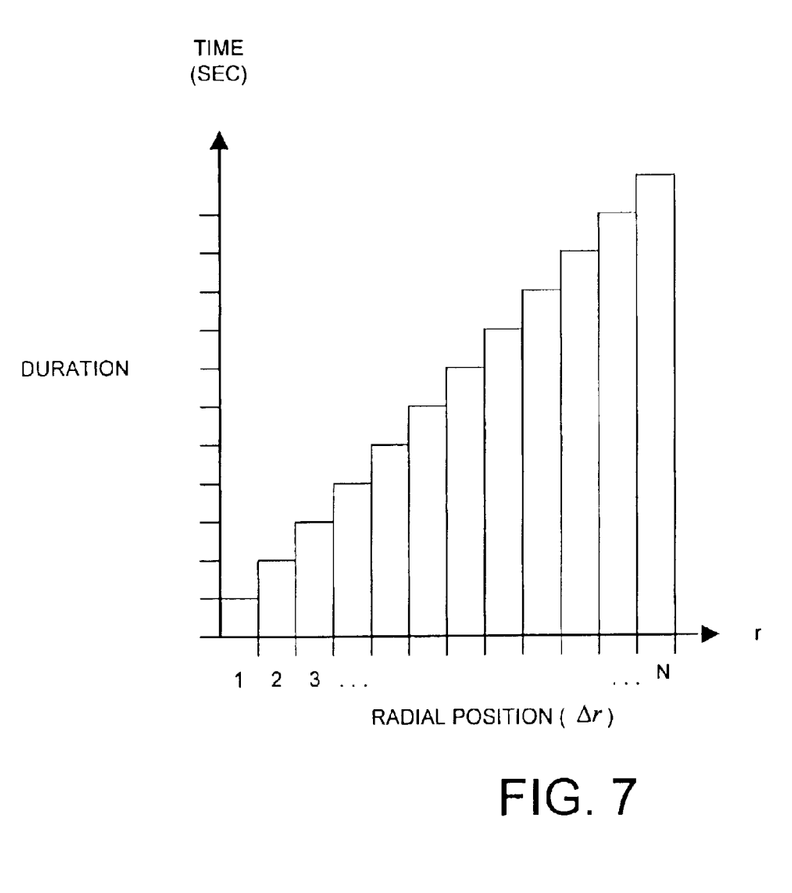
FIG. 7 is a graph showing the time the nozzle spends at each radial position according to one embodiment of the present invention.

FIG. 7 is a graph showing the time spent over any particular strip is proportional to the radial position. The use of a stepping motor to position the arm 140 is advantageous over a constant speed motor or a variable speed motor for delivering constant total energy to all points on the workpiece 125. The size of each step that arm motor 150 is operable to move arm 140 is a function the precision of the stepping motor the working distance between the nozzle and the workpiece, and the length of the arm. For example, the strip width for a 1.7-degree stepping motor, a 7" arm, and a 12 mm working distance, has 5 mm steps. Thus, a workpiece having a radius of 10 cm would have 20 steps.

It is generally desirable that the strip of width $\Delta r$ be approximately the same size as the nozzle aperture diameter (d). However, if d is greater than or less than $\Delta r$, small correction steps may be used to compensate. For example, in the above example, the Pulse Jet nozzle made by HONDA ELECTRONICS, which has an aperture diameter of 4.2 mm, may be used.

For a workpiece 125 of radius r rotating about a fixed axis, having N strips, with the width of each strip $\Delta r$, if the time the nozzle head spends over strip i is defined as $t_i$, then the time spent over any interval ($t_i$) is proportional to $\Delta t \times i$. For the strip closest to the center of the workpiece 125, i=1, and the time spent is $$t_1 = \Delta t \times 1 = \Delta t \quad \text{(Eq. 5)}$$

For the strip on the edge of the workpiece 125, $$t_N = \Delta t \times N = \Delta t N \quad \text{(Eq. 6)}$$

By selecting the appropriate $\Delta t$ for each strip using known techniques, the present invention is therefore capable of delivering constant megasonic energy across a workpiece 125.

It is noted that the time spent in each strip ($t_n$) could be kept them same (equal to $\Delta t$), and the amount of energy delivered varied based on the radial distance. However, this is not feasible without the use of expensive programmable tuned RF power supplies. In contrast, high precision controllers for stepping motors are readily available and less expensive.

With embodiments of the present invention, as the stream of cleaning fluid 105 moves stepwise from the center of the workpiece 125 towards the outermost radial position N, the amount of time spent on each section increases a proportional amount. Therefore, for instances of megasonic applications, the total amount of megasonic energy applied to points on the workpiece 125 remains substantially constant. Though it may be desirable in some instances to deliver exactly uniform energy, in other instances a small error may be tolerable without departing from the scope of the invention.

Many stepping motors use a pulses to determine how much time to spend at each radial position. For example, with larger pulses, the stepper motor 150 would keep arm in a particular radial position longer than with shorter pulses. In one particular embodiment, a programmable logic chip, such as the MICROCHIP MODEL PIC16C175 microprocessor may be used as part of control module 170 to generate a train of pulses to vary the time the arm spends from large (at the edge of the workpiece 125) to small (at the center of the workpiece 125). In addition, the microprocessor can be programmed to automatically calculate the number of steps it needs to take for each workpiece from user-supplied, automatically-detected, or other data.

Referring back to FIG. 7, the height at each bar represents the total time spent by the nozzle at the respective step. It may occur in one pass of the nozzle 120 over the workpiece 125, or it may occur over several passes.

Preventing Reattachment and Contamination

Once the megasonic agitation and rinsing cycles are complete, it is important to prevent particles from reattaching to the workpiece and from new particles from contaminating the wet workpiece. One way to slow or prevent reattachment back to the surface is by changing the Zeta potential of the particles and the workpiece. Another is with high RPM drying.

As the Zeta potential of contaminants suspended in the cleaning fluid 105 changes to the same polarity as the workpiece 125, a repulsive force is created between the contaminants and the workpiece 125. Maintaining a repulsive force delays or even prevents particles from reattaching to the workpiece 125 before the cleaning fluid 105 is removed during the spin dry cycle. In one embodiment of the present invention, the Zeta potentials of the workpiece 125 and contaminants are altered by exposing the workpiece 125 and contaminants to solution with strong alkaline solution. In particular, an alkali pH of about 9 produces a strong repulsive force between the typical workpieces made of silicon and common contaminant materials (e.g., $SiO_2$) by decreasing their Zeta potentials such that they are both negative. Advantageously, this helps prevent particles from reattaching until they are removed by high-RPM spin drying. This process is discussed more fully in Werner Kern, "Silicon Wafer Cleaning: A Basic Review," presented at the 8th International Symposium, May 21, 2001, which is incorporated herein by reference.

The cleaning process contemplated by the present invention may include several cycles. Generally, a process to remove contaminants may include megasonic cleaning cycle and an optional chemical cleaning cycle, followed by a spin-dry cycle. The order, frequency of application of megasonic energy and chemicals, the number, RPM, and duration of cleaning cycles, and the RPM and duration of a drying cycle all depend on several factors, including the number and type of contaminants, the size and material of the workpiece 125, working parameters of nozzle 120, and the yield requirements.

With respect to drying, an angular velocity of 3500 RPM or higher is generally sufficient. The optimal drying angular velocity may vary for different semiconductor parts due to factors such as the semiconductor material properties and reactivity, kinematic viscosity, dynamic viscosity, temperature, and pH of the cleaning fluid 105, and Zeta potential of contaminants. In addition, the velocity made need to be increased or decreased with the use of drying aids such as fluids and/or gases. For example, in one embodiment, isopropyl alcohol (IPA) and nitrogen gas ($N_2$) is used to aid in drying. Here, the drying angular velocity may be reduced proportional to the amount of IPA and $N_2$ that is used.

Figure 8:
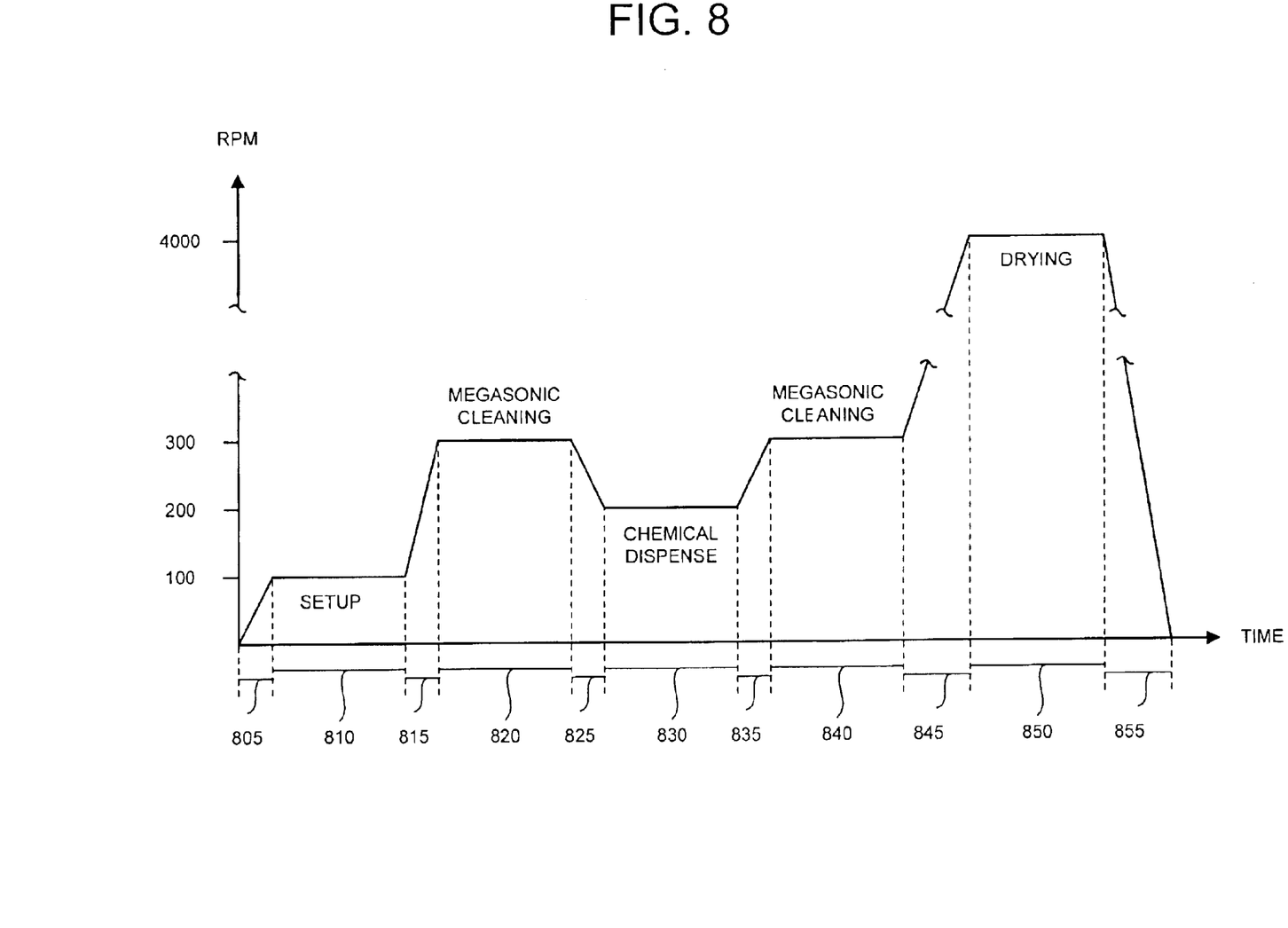
FIG. 8 is a graph showing the revolutions per minute and sequence of the different cycles in a cleaning process in accordance to one embodiment of the present invention.

FIG. 8 illustrates the steps involved in a cleaning process and the angular velocity of the workpiece related to each of the steps, according to one exemplary embodiment. It is noted that the invention is not limited solely to this embodiment. As shown, in applications with contaminants that may difficult to remove, two megasonic cleaning cycles with an intervening chemical cleaning cycle in which one or more chemicals (or other cleaning fluids 105) can be dispensed for a desired length of time may be used. During chemical cleaning cycle, mild etching, dissolving, or adjustment of the pH can be accomplished before second megasonic clean cycle starts.

In the set-up cycle 810, the workpiece 125 may be spun at very low RPMs, such as at 100 RPM, deionized water is turned on, and the megasonic power level is adjusted while the nozzle 120 is positioned off the surface of the workpiece 125.

The system then transitions 815 to megasonic cleaning cycle 820, where a megasonic cleaning stream is applied to the workpiece 125, as described above. Specifically, the workpiece 125 spins at 300 RPM, which is within the optimal angular velocity described above of between 200–500 RPM, while nozzle 120 is moved stepwise over the workpiece 125 while delivering a substantially uniform amount megasonic energy to each point on the workpiece 125.

The cleaning system then transitions 825 to chemical dispense cycle 830. In the chemical dispense cycle 830, the workpiece 125 spins at 200 RPM and chemicals, for example acids, solvents, or surfactants, may be dispensed sequentially or simultaneously from one or more conduits. The conduits may be connected to pressurized canisters or pumps. In other embodiments (not shown) chemical dispense cycle 830 may occur before megasonic cleaning.

The second megasonic cleaning cycle 840 is similar to the first cleaning cycle 820. The second cleaning cycle removes contaminants detached by the chemicals as well as residues from the chemical dispense cycle 830.

During the drying cycle 850, the arm 140 rotates away from the workpiece 125 and the workpiece 125 is accelerated to a higher angular velocity of approximately 3500 RPMs, as mentioned above, to remove all the cleaning fluids 105. Additionally, a nitrogen ($N_2$) flow and isopropyl alcohol (IPA) dispense may be used to augment the drying process.

In cycle transitions 805, 815, 825, 835, 845, and 855 the workpiece is spun up or down to the angular velocity of the next cycle. In some embodiments, it may be desirable to minimize the transition time. In other embodiments, any conduits 115 for dispensing chemicals or other cleaning fluid 105 may be flushed, such as with $N_2$ in the transition before and/or after the chemical dispense cycle 830.

Advantageously, the system of the present invention has the functionality of multiple prior art machines. Since each machine requires a specified amount of floor space (i.e., its footprint), the elimination of the need for multiple machine in the present invention decreases the total footprint necessary for the processing room when compared to prior art devices utilizing separate machines. Another advantage of cleaning and drying with the same apparatus is the elimination of certain avenues for contamination. In prior art systems, clean workpieces must be removed from the cleaning apparatus and placed into another machine for drying. As the workpiece is removed from the cleaning device, transported to the drying device, and placed in the drying device, there exists the possibility for contamination.

Another advantage to the manner in which the present invention dries parts is the symmetrical drying. Some existing wafer dryers dry multiple stacks of semiconductor parts positioned about a central axis at the same time, creating an asymmetric drying gradient across any individual workpiece. In contrast, because the present invention dries a single workpiece about the central axis of rotation, a symmetric drying gradient is created.

A further advantage of the present system is its flexibility. By varying the size of the arm 140, and the shape of chuck 160, the system is compatible with a variety of workpiece sizes. For example, without limitation, the present invention contemplates cleaning wafers of up to 12" and greater.

The illustrated system 100 is shown as a manual-load single workpiece 125 (wafer, mask, disk or platen holding optical or other semiconductor parts) cleaning system. However, it will be understood by those skilled in the art that by adding a robotic wafer handling system it could be a fully automated cassette to cassette system. In addition, because systems in accordance with the present invention are equipped with chemical dispense capability, they can be integrated into a cabinet with pumps, filters, and chemicals to produce stand-alone chemical processing stations with chemical cleaning and drying.

In some embodiments (not shown), several cleaning systems 100 may be installed into a micro clean environment to produce a high volume manufacturing workpiece 125 cleaning system. In one specific embodiment, robotics may be used to automate workpiece loading and unloading.

In other embodiments (not shown), one or more cleaning systems 100 may be installed with other deposition and/or etching tools under one mini clean environment with robotics, as part of a cluster.

An alternative embodiment passes ozonated deionized water through the megasonic nozzle rather than deionized water; thereby the needed chemical cleaning is provided without use of other acids and solvents.

The preceding examples are included to demonstrate specific embodiments of the invention. It should be appreciated by those of skill in the art that the techniques disclosed in the examples which follow represent techniques discovered by the inventor to function well in the practice of the invention, and thus can be considered to constitute preferred modes for its practice. However, it should be understood that the invention is not intended to be limited to the particular forms disclosed. Rather, the different aspects of the disclosed compositions and methods may be utilized in various combinations and/or independently. Thus the invention is not limited to only those combinations shown herein, but rather may include other combinations. Further, those of skill in the art should, in light of the present disclosure, appreciate that many changes can be made in the specific embodiments which are disclosed and still obtain a like or similar result without departing from the spirit and scope of the invention.

What is claimed is:

1. A method for removing contaminants from the surface of a workpiece comprising the steps of:

rotating the workpiece about an axis, at a low angular velocity;

directing a stream of cleaning fluid, having megasonic energy, at a surface of the workpiece, such that said stream of cleaning fluid delivers substantially uniform megasonic energy to all points on the surface of the workpiece, and then rotating the workpiece at a high angular velocity until the surface of the workpiece is dry of cleaning fluids.

2. The method of claim 1, wherein said low angular velocity is between 200 and 500 revolutions per minute.

3. The method of claim 1, wherein said high angular velocity is 3500 revolutions per minute or higher.

4. The method of claim 1, wherein said cleaning fluid comprises deionized water.

5. The method of claim 4, wherein said deionized water is ozonated.

6. The method of claim 1, wherein said cleaning fluid comprises acid.

7. The method of claim 1, wherein said cleaning fluid comprises one or more surfactants.

8. The method of claim 1, wherein said cleaning fluid is operable to alter the Zeta potential of one or more of the contaminants and the surface of the workpiece to increase the repulsion between said one or more contaminants and the workpiece.

9. The method of claim 1, further comprising the step of delivering a cleaning fluid to the workpiece while the workpiece is rotating at a low angular velocity.

10. The method of claim 1, further comprising the step of delivering a drying fluid to the workpiece while the workpiece is rotating at a high angular velocity.

11. The method of claim 1, wherein the workpiece is a semiconductor wafer.

12. A method for removing contaminants from the surface of a workpiece comprising the steps of:
rotating the workpiece about an axis, at a low angular velocity;
directing a stream of cleaning fluid, wherein the stream of cleaning fluid comprises megasonic energy, through a nozzle at a surface of the workpiece, while moving the nozzle over the workpiece such that said stream of cleaning fluid delivers substantially uniform megasonic energy to all points on the surface of the workpiece; and
then rotating the workpiece at a high angular velocity until the surface of the workpiece is dry of cleaning fluids.

13. The method of claim 12, wherein the step of moving the nozzle over the workpiece further comprises moving the nozzle over the workpiece in a stepwise manner.

14. The method of claim 13, wherein the step of moving the nozzle over the workpiece in a stepwise manner comprises stopping the nozzle over each of a plurality of radial strips of the workpiece for an amount of time proportional to each strip's radial distance.

15. The method of claim 12, wherein the step of directing a stream of cleaning fluid further comprises directing said stream of cleaning fluid at an optimal angle to the surface of the workpiece.

16. The method of claim 15, wherein the optimal angle is between 60 and 70 degrees with respect to the surface of the workpiece.

17. The method of claim 12, wherein the nozzle is maintained at a fixed distance from the surface of the workpiece during the step of moving the nozzle over the workpiece.

18. The method of claim 17, wherein the fixed distance is approximately 12 mm.

19. A method for removing contaminants from a workpiece having a top surface and a bottom surface, comprising the steps of:
rotating the workpiece at a low angular velocity;
directing a first stream of cleaning fluid, wherein the first stream of cleaning fluid comprises megasonic energy, through a first nozzle at the top surface of the workpiece, while moving the first nozzle transversely over said top surface such that said first stream of cleaning fluid delivers substantially uniform megasonic energy to all points on the top surface, wherein at least a portion of the megasonic energy delivered to the top surface propagates to the bottom surface;
directing a second stream of cleaning fluid at the bottom surface of the workpiece; and
then rotating the workpiece at a high angular velocity until the workpiece is dry of cleaning fluids.

20. The method of claim 19, wherein the second steam of cleaning fluid comprises deionized water.

21. A method for cleaning contaminants from the surface of a workpiece, comprising the steps of:
providing a megasonic cleaning stream by applying megasonic energy to at least one stream of cleaning fluid;
directing at an optimal angle said at least one megasonic cleaning stream to the surface of the workpiece;
rotating the workpiece at a low angular velocity sufficient to maintain a uniform laminar flow profile of the megasonic cleaning stream on the surface of the workpiece; and
moving said megasonic cleaning stream over the workpiece such that a substantially uniform amount of megasonic energy is delivered to each point on the workpiece.

22. The method of claim 21, further comprising the step of rotating the workpiece at a high angular velocity until the workpiece is dry of cleaning fluids.

23. A method for cleaning contaminants from the surface of a workpiece, comprising the steps of:
providing a megasonic cleaning stream by applying megasonic energy to at least one stream of cleaning fluid;
directing at an angle between 60 and 70 degrees said at least one megasonic cleaning stream to the surface of the workpiece;
rotating the workpiece at a low angular velocity sufficient to maintain a uniform laminar flow profile of the megasonic cleaning stream on the surface of the workpiece; and
moving said megasonic cleaning stream over the workpiece such that a substantially uniform amount of megasonic energy is delivered to each point on the workpiece.

24. A method for cleaning contaminants from the surface of a workpiece, comprising the steps of:
providing a megasonic cleaning stream by applying megasonic energy to at least one stream of cleaning fluid;
rotating the workpiece at a low angular velocity sufficient to maintain a uniform laminar flow profile of the megasonic cleaning stream on the surface of the workpiece; and
moving said megasonic cleaning stream over the workpiece such that a substantially uniform amount of megasonic energy is delivered to each point on the workpiece, wherein said moving includes directing said stream at each, in turn, of a selected plurality of radii of said workpiece for a selected period of time, each period of time being selected in order to achieve substantially uniform distribution of megasonic energy to each point on the workpiece.

* * * * *